(12) United States Patent
Wostyn et al.

(10) Patent No.: US 11,996,459 B2
(45) Date of Patent: May 28, 2024

(54) COUNTERACTING SEMICONDUCTOR MATERIAL LOSS DURING SEMICONDUCTOR STRUCTURE FORMATION

(71) Applicant: IMEC VZW, Leuven (BE)

(72) Inventors: Kurt Wostyn, Lubbeek (BE); Yusuke Oniki, Leuven (BE); Hans Mertens, Leuven (BE)

(73) Assignee: Imec vzw, Leuven (BE)

( * ) Notice: Subject to any disclaimer, the term of this patent is extended or adjusted under 35 U.S.C. 154(b) by 261 days.

(21) Appl. No.: 17/308,453

(22) Filed: May 5, 2021

(65) Prior Publication Data
US 2021/0351275 A1 Nov. 11, 2021

(30) Foreign Application Priority Data

May 8, 2020 (EP) ..................... 20173771

(51) Int. Cl.
*H01L 29/00* (2006.01)
*H01L 21/311* (2006.01)
*H01L 29/423* (2006.01)
*H01L 29/66* (2006.01)
*H01L 29/786* (2006.01)

(52) U.S. Cl.
CPC ...... *H01L 29/42392* (2013.01); *H01L 21/311* (2013.01); *H01L 29/6653* (2013.01); *H01L 29/66545* (2013.01); *H01L 29/78696* (2013.01)

(58) Field of Classification Search
CPC ........... H01L 29/42392; H01L 29/0673; H01L 29/66545
See application file for complete search history.

(56) References Cited

U.S. PATENT DOCUMENTS

| 9,947,804 | B1 | 4/2018 | Frougier et al. |
| 10,243,043 | B2 | 3/2019 | Mochizuki et al. |
| 10,269,983 | B2 | 4/2019 | Frougier et al. |

(Continued)

OTHER PUBLICATIONS

Extended European Search Report and Written Opinion, EP Application 20173771.5, dated Oct. 15, 2020, 9 pages.

(Continued)

*Primary Examiner* — Reema Patel
(74) *Attorney, Agent, or Firm* — McDonnell Boehnen Hulbert & Berghoff LLP (57) ABSTRACT

Example embodiments relate to counteracting semiconductor material loss during semiconductor structure formation. One embodiment includes a method for forming a semiconductor structure. The method includes providing a structure. The structure includes a substrate. The structure also includes a layer stack on the substrate. The layer stack includes at least one semiconductor layer of a semiconductor material and at least one sacrificial layer under the semiconductor layer. Further, the structure includes a trench through the layer stack. The further also includes forming a recess in the layer stack by etching a portion of the sacrificial layer exposed by the trench. The etching includes a preferential etch of the sacrificial layer with respect to the semiconductor layer. Additionally, the method includes epitaxially growing a liner of the semiconductor material onto surfaces of the semiconductor layer exposed by the trench.

10 Claims, 3 Drawing Sheets

(56) References Cited

U.S. PATENT DOCUMENTS

| | | | |
|---|---|---|---|
| 10,535,733 B2 | 1/2020 | Cheng et al. | |
| 2018/0294331 A1 | 10/2018 | Cho et al. | |
| 2019/0058052 A1 | 2/2019 | Frougier et al. | |
| 2019/0229184 A1* | 7/2019 | Shank | H01L 21/02636 |
| 2019/0305104 A1 | 10/2019 | Xie et al. | |
| 2019/0341467 A1 | 11/2019 | Basker et al. | |
| 2021/0226066 A1* | 7/2021 | Young | H01L 29/7848 |

OTHER PUBLICATIONS

Barraud, S., V. Lapras, B. Previtali, M. P. Samson, J. Lacord, S. Martinie, M-A. Jaud et al. "Performance and design considerations for gate-all-around stacked-NanoWires FETs." In 2017 IEEE international electron devices meeting (IEDM), pp. 29-2. IEEE, 2017.

Mertens, H., R. Ritzenthaler, V. Pena, G. Santoro, K. Kenis, A. Schulze, E. D. Litta et al. "Vertically stacked gate-all-around Si nanowire transistors: Key process optimizations and ring oscillator demonstration." In 2017 IEEE International Electron Devices Meeting (IEDM), pp. 37-4. IEEE, 2017.

Ryckaert, J., M. H. Na, P. Weckx, D. Jang, P. Schuddinck, B. Chehab, S. Patli et al. "Enabling Sub-5nm CMOS Technology Scaling Thinner and Taller!." In 2019 IEEE International Electron Devices Meeting (IEDM), pp. 29-4. IEEE, 2019.

Weckx, P., J. Ryckaert, E. Dentoni Litta, D. Yakimets, P. Matagne, P. Schuddinck, D. Jang et al. "Novel forksheet device architecture as ultimate logic scaling device towards 2nm." In 2019 IEEE International Electron Devices Meeting (IEDM), pp. 36-5. IEEE, 2019.

* cited by examiner

COUNTERACTING SEMICONDUCTOR MATERIAL LOSS DURING SEMICONDUCTOR STRUCTURE FORMATION

CROSS-REFERENCE TO RELATED APPLICATIONS

The present application is a non-provisional patent application claiming priority to European Patent Application No. EP 20173771.5, filed May 8, 2020, the contents of which are hereby incorporated by reference.

FIELD OF THE DISCLOSURE

The present disclosure relates to forming semiconductor structures and more in particular to counteracting semiconductor material loss during such formation.

BACKGROUND

Gate-all-around (GAA) field-effect transistor (FET) architectures are being put forward to succeed fin FET architectures in advanced complementary metal-oxide-semiconductor (CMOS) devices, particularly for the 5 nm technology node and beyond. Such a GAA FET may typically be based on one or more nanowires or nanosheets. The design may be relatively straightforward—such as for a nanowire FET or nanosheet FET—, but may also be more involved—such as for a forksheet FET or complementary FET (CFET). An evolutionary path for sub-5 nm CMOS technology scaling—from nanosheet, over forksheet to CFET—has been proposed by Ryckaert et al. (RYCKAERT, J., et al. Enabling Sub-5 nm CMOS Technology Scaling Thinner and Taller!. In: 2019 *IEEE International Electron Devices Meeting (IEDM)*. IEEE, 2019. p. 29.4. 1-29.4. 4).

Vertically stacked GAA Si nanowire FETs have for example been demonstrated by Mertens et al. (MERTENS, H., et al. Vertically stacked gate-all-around Si nanowire transistors: Key process optimizations and ring oscillator demonstration. In: 2017 *IEEE International Electron Devices Meeting (IEDM)*. IEEE, 2017. p. 37.4. 1-37.4. 4).

Barraud et al. have also illustrated stacked GAA Si nanowire and nanosheet FETs (BARRAUD, S., et al. Performance and design considerations for gate-all-around stacked-nanowires FETs. In: 2017 *IEEE International Electron Devices Meeting (IEDM)*. IEEE, 2017. p. 29.2. 1-29.2. 4).

However, further improvements are still needed before these GAA FETs can become commercially relevant.

SUMMARY

The present disclosure provides a method for forming a semiconductor structure. The present disclosure also provides uses and semiconductor structures associated therewith.

In some embodiments, when forming a recess in a sacrificial layer with respect to a semiconductor layer, semiconductor material loss (e.g. distal thinning of the semiconductor layer) can be compensated for. Further, in some embodiments, a distal thickness of the semiconductor layer can be (partially) restored or further increased.

In some embodiments, an access resistance to the semiconductor layer can be decreased.

Embodiments can apply to various semiconductor structures, including GAA FETs such as nanowire, nanosheet, forksheet, or complementary CFETs.

Embodiments can be performed in a relatively straightforward and economical fashion.

In a first aspect, the present disclosure relates to a method for forming a semiconductor structure, comprising: (a) providing a structure comprising (i) a substrate, (ii) a layer stack on the substrate, the layer stack comprising at least one semiconductor layer of a semiconductor material and at least one sacrificial layer under the semiconductor layer, and (iii) a trench through the layer stack; (b) forming a recess in the layer stack by etching a portion of the sacrificial layer exposed by the trench, the etching being such that the sacrificial layer is etched preferentially with respect to the semiconductor layer; and (c) epitaxially growing a liner of the semiconductor material onto surfaces of the semiconductor layer exposed by the trench.

Figure 1:
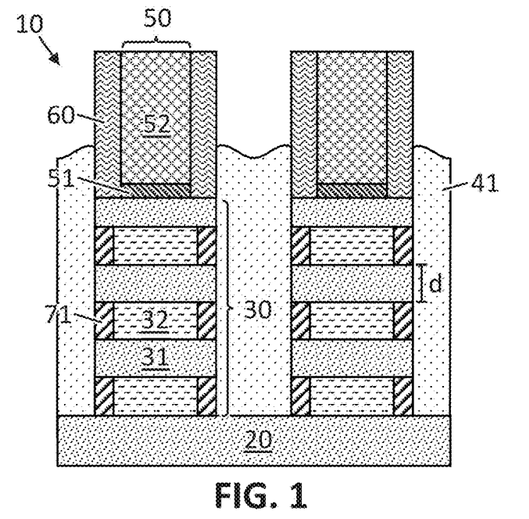
FIG. 1 schematically depicts an idealized semiconductor structure that could be obtained as schematically depicted in FIG. 1. However, it was observed within the present disclosure that, in reality, a structure as schematically depicted in FIG. 2.
Figure 2:
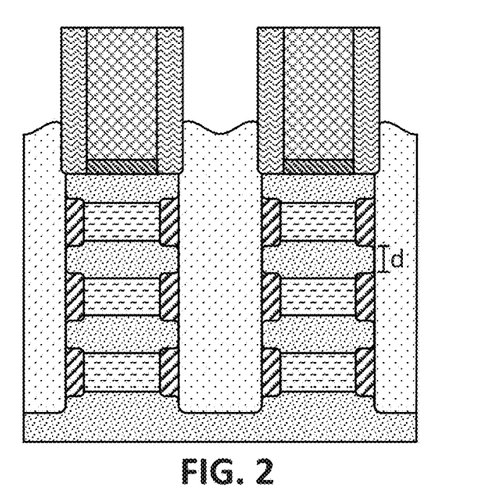
FIG. 2 schematically depicts a more realistic version of the semiconductor structure of FIG. 1, illustrating the outcome of undesired semiconductor material loss.

If—in a method that doesn't employ step c—step b could be performed perfectly selective with respect to the semiconductor layer, inner spacers could be formed in the recesses (cf. step d) and an idealized structure could be obtained as schematically depicted in FIG. 1; the latter showing a semiconductor structure (10) comprising a layer stack (30) of alternating sacrificial layers (32) and semiconductor layers (31) on a substrate (20), source/drain structures (41) running through the layer stack (30), dummy gate regions (50) on the layer stack (30) comprising a dummy gate oxide (51) and a dummy gate (52), gate spacers (60) flanking the dummy gate region (50) and inner spacers (71) abutting the sacrificial layers (32). However, it was observed that in reality a structure (10) as schematically depicted in FIG. 2 is typically obtained, where the inner spacers (71) partially extent into the semiconductor layer (31) and the distal thickness (d) of each semiconductor layer (31) is reduced. This is also the case for—cf. supra—Barraud et al. (as e.g. clearly visible in FIG. 2(3) therein) and Mertens et al. (somewhat less apparent in e.g. FIG. 17(c), but was confirmed to be so); even if this problem was as such not discussed in these disclosures. Such semiconductor layer distal thinning consequently leads to a reduced contact area between each semiconductor layer (31) and the source/drain structure (41), resulting in an increased parasitic resistance and thus an increased access resistance to the semiconductor layer (31).

Figure 3:
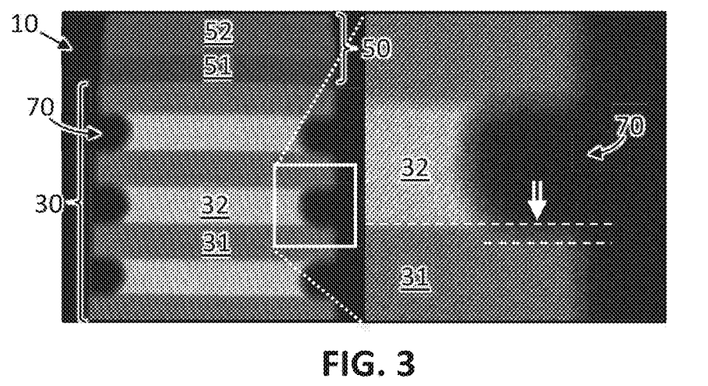
FIG. 3 shows transmission electron microscopy (TEM) images that illustrate the problem of undesired semiconductor material loss.
Figure 4:
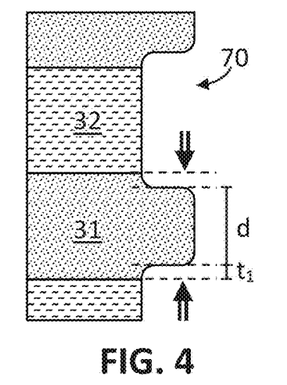
FIG. 4 further schematically depicts the problem of undesired semiconductor material loss.

This observation of semiconductor layer distal thinning was presently traced back to the fact that such perfect selectivity can generally not actually be achieved and that some semiconductor material loss therefore inevitably occurs. Without being bound by theory, this unwanted loss could have a variety of causes, such as one or more of: (i) finite etch selectivity between the bulk semiconductor material (e.g. Si) and the bulk sacrificial material (e.g. SiGe); (ii) intermixing of (bulk) semiconductor and sacrificial materials at the semiconductor/sacrificial layer interface; and (iii) oxidation of the semiconductor layer surface (e.g. native oxide formation). Regardless however of whether it is due to a lack of selectivity between the materials as such and/or due to some interfacial or surface effect, the etching causes some semiconductor material loss to occur, thereby making the recesses (70) partially extent into the semiconductor layer (31) and thus thinning the distal thickness (d) of each semiconductor layer (31). This is also evident from the transmission electron microscopy (TEM) images in FIG. 3 and is further schematically depicted in FIG. 4. As previously indicated, after inner spacer (71) (cf. step d) and source/drain structure (41) (cf. step e) formation, the contact area between each semiconductor layer (31) and the source/drain structure (41) is then consequently reduced (cf. FIG. 2), resulting in an increased parasitic resistance and thus an increased access resistance to the semiconductor layer (31).

Figure 5:
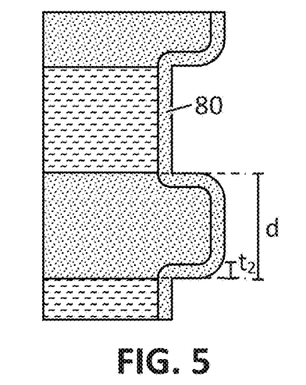
FIG. 5 schematically depicts the provision of a liner to compensate the undesired semiconductor material loss, according to example embodiments.
Figure 6:
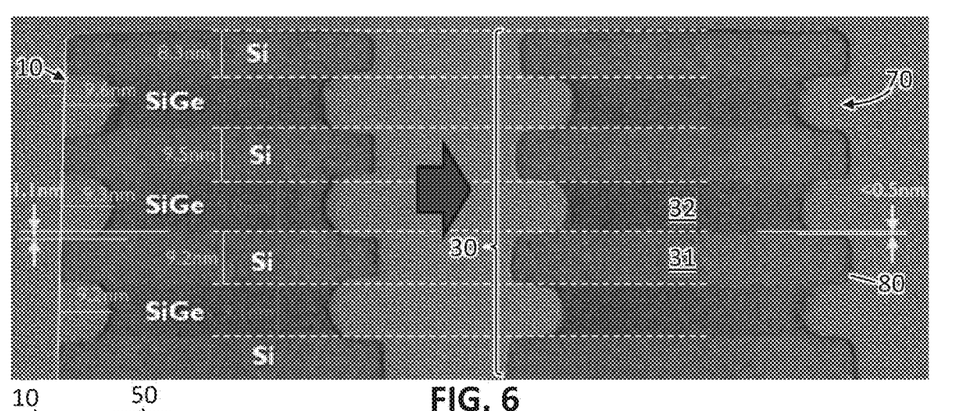
FIG. 6 shows transmission electron microscopy (TEM) images that illustrate the difference between not using (left) and using (right) a liner, according to example embodiments.

To address the above problem, it was conceived to form a liner (80) of the semiconductor material (step c) on the semiconductor layer (31)—and optionally on the sacrificial aterial—; as schematically depicted in FIG. 5. In doing so, the semiconductor material loss of step b can be (at least partially) compensated and the distal thickness (d) of the semiconductor layers (31) can be (at least partially) restored. This can also be seen in FIG. 6, which shows a TEM image of a semiconductor structure (10) without (left) and with (right) semiconductor material liner (80). Although the liner (80) as such is therein not particularly distinguishable from the semiconductor layer (31) (and sacrificial layer (32)), it is nevertheless clear that the semiconductor material loss in the left semiconductor structure (10) is considerably reduced on the right side. More specifically,—as indicated in FIG. 6—a height difference between an edge at the distal end and an edge near the middle of the semiconductor layer (31) measures about 1.1 nm for the left semiconductor structure (10) and less than 0.5 nm for the right semiconductor structure (10); i.e. the reduction in distal thickness (d) amounts to about 2.2 nm and less than 1 nm respectively.

In a second aspect, the present disclosure relates to a semiconductor structure, comprising: (i) a substrate; (ii) a layer stack on the substrate, the layer stack comprising at least one semiconductor layer of a semiconductor material and at least one ancillary layer under the semiconductor layer; (iii) a trench through the layer stack; (iv) a recess with respect to the semiconductor layer, the recess abutting the ancillary layer; and (v) a liner of the semiconductor material lining the semiconductor layer—and optionally the ancillary layer—with respect to the trench.

In a third aspect, the present disclosure relates to a use of a liner of semiconductor material in a semiconductor structure as defined in any of embodiment of the second aspect, for decreasing an access resistance to the semiconductor layer.

Particular aspects are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial improvements, including departures from prior practices, resulting in the provision of more efficient, stable and reliable devices of this nature.

The above and other characteristics and features will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

In the different figures, the same reference signs refer to the same or analogous elements.

DETAILED DESCRIPTION

Reference will now be made in detail to example embodiments, which are illustrated in the accompanying drawings. However, the following embodiments may be variously modified and the range of the present disclosure is not limited by the following embodiments.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable with their antonyms under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of example embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

Reference will be made to transistors. These are devices having a first main terminal (e.g. a source or collector), a second main terminal (e.g. a drain or emitter) and a control terminal (e.g. a gate or base) for controlling the flow of electrical charges between the first and second main terminals.

The following terms are provided solely to aid in the understanding of the disclosure.

As used herein, and unless otherwise specified, under "source/drain structure" is understood a "source structure and/or drain structure". In embodiments, a source structure and a drain structure may be comparable (e.g. indistinguishable) and their designation may depend on a relative voltage difference that is put across them in the final semiconductor structure.

As used herein, and unless otherwise specified, when a first entity (e.g. a first layer or material) is said to be removed (e.g. etched) selectively with respect to a second entity (e.g. a second layer or material), this means that the first entity is removed faster than the second entity. In some embodiments, the removal (e.g. etching) process would remove the first entity at least twice faster, or at least five times faster, or even at least ten times faster, than the second entity. In some embodiments, the second entity may be substantially not removed by the removal process.

As used herein, and unless otherwise specified, a "dummy" entity (e.g. a dummy gate region) is a non-functional entity which is typically used as a placeholder, to be replaced by a functional entity at some later stage of the semiconductor processing. For example, a dummy gate region may be replaced by a functional gate region during a replacement metal gate process. The "dummy" entity may alternatively be referred to as a "sacrificial" entity.

In a first aspect, the present disclosure relates to a method for forming a semiconductor structure, comprising: (a) providing a structure comprising (i) a substrate, (ii) a layer stack on the substrate, the layer stack comprising at least one semiconductor layer of a semiconductor material and at least one sacrificial layer under the semiconductor layer, and (iii) a trench through the layer stack; (b) forming a recess in the layer stack by etching a portion of the sacrificial layer exposed by the trench, the etching being such that the sacrificial layer is etched preferentially with respect to the semiconductor layer; and (c) epitaxially growing a liner of the semiconductor material onto surfaces of the semiconductor layer exposed by the trench.

In embodiments, the semiconductor structure may comprise—or may be—a gate-all-around (GAA) field-effect transistor (FET), such as a nanowire, nanosheet, forksheet, or complementary field-effect transistor. In embodiments, the method may thus be for forming a gate-all-around field-effect transistor, such as a nanowire, nanosheet, forksheet, or complementary field-effect transistor. Forksheet FETs have for example been described by Weckx et al. (WECKX, P., et al. Novel forksheet device architecture as ultimate logic scaling device towards 2 nm. In: 2019 IEEE International Electron Devices Meeting (IEDM). IEEE, 2019. p. 36.5. 1-36.5. 4), which is incorporated herein by reference.

In embodiments, the substrate may be a semiconductor substrate, such as a group IV substrate (e.g. Si, Ge, or SiGe), a III-V substrate or a semiconductor-on-insulator substrate.

The at least one semiconductor layer is a layer of the semiconductor material; i.e. it may comprise or consist of the semiconductor material. In some embodiments, a bulk of the semiconductor layer may substantially comprise (e.g. consist of) the semiconductor material while a surface or interface comprises (e.g. consist of) a derivative of the semiconductor material (e.g. a native oxide or an intermixed material). In embodiments, the semiconductor material may be a group IV material (e.g. Si, Ge, or SiGe) or a III-V material (e.g. $Al_xGa_{1-x}As$, GaN, InAs, or $Ga_xIn_{1-x}P$). In embodiments, the semiconductor layer may be a nanowire or a nanosheet.

The at least one sacrificial layer is typically a layer of a sacrificial material; i.e. it may comprise or consist of the sacrificial material. In embodiments, the sacrificial material may likewise be a semiconductor material (in which case it could alternatively be referred to as a "sacrificial semiconductor material"). In embodiments, the sacrificial layer may be a nanowire or a nanosheet. The designation "semiconductor layer/material" and "sacrificial layer/material" thus refers to their function in the method. More in particular, a semiconductor layer is typically to be maintained through the method (e.g. in order to fulfil an active role in the final semiconductor structure), whereas a sacrificial layer is intended to be sacrificed in the course of the method. As such, the semiconductor layer/material could also be referred to as an "active semiconductor layer/material" (e.g. in contrast with a "sacrificial semiconductor layer/material"). The aforementioned notwithstanding, the sacrificial and semiconductor materials may—though need not—be selected from a same list of materials; for example, SiGe could be a sacrificial material in one embodiment and a semiconductor material in different embodiment.

In embodiments, the layer stack may comprise a plurality of semiconductor layers alternated with sacrificial layers. In some embodiments, at least a bottom layer of the layer stack may be one of the sacrificial layers. In embodiments, a top layer of the layer stack may be one of semiconductor layers or one of the sacrificial layers.

In embodiments, the semiconductor structure may further comprise: (vi) a dummy gate region over (e.g. directly on) the layer stack. In embodiments, the dummy gate region may comprise a dummy gate oxide (e.g. $SiO_2$) and a dummy gate (e.g. poly-Si). In embodiments, the semiconductor structure may further comprise: (vii) gate spacers (e.g. SiCON or SiBCN) flanking the dummy gate region.

Note that—even though the sacrificial layer is in step b etched preferentially with respect to the semiconductor layer—the etch selectivity that can be achieved is typically inevitably finite (i.e. a perfect selectivity cannot be achieved), so that some semiconductor material loss is typically unavoidable (cf. supra). As such, a portion of the semiconductor layer will nevertheless also be etched in step b.

In view of this finite etch selectivity, step c then allows to (at least partially) recover this semiconductor material loss, by epitaxially growing the semiconductor material liner onto surfaces of the semiconductor layer exposed by the trench. In some embodiments, the liner may be grown epitaxially onto the semiconductor layer surfaces selectively with respect to surfaces of the sacrificial layer. In other embodiments, step c may further comprise growing the liner onto surfaces of the sacrificial layer exposed by the trench (i.e. the liner may be grown epitaxially onto both semiconductor layer surfaces and sacrificial layer surfaces). Having the liner also on the sacrificial layer surfaces may have an undesired effect in that also this portion of the liner will typically remain in the final semiconductor structure and can increase the parasitic capacitance therein (e.g. by reducing the effectiveness of the inner spacers; cf. infra). As such, in some embodiments, the liner may only be selectively grown on the semiconductor layer surfaces. However, for some combinations of semiconductor and sacrificial layers (e.g. Si and SiGe), such growth selectivity may be challenging or even impossible to achieve. Nevertheless, growing the liner on both the semiconductor layer surfaces and sacrificial layer surfaces still yields beneficial results, though it may be desired to then take into account the effect of the liner on e.g. the parasitic capacitance in the final semiconductor structure. For example, this may comprise striking a balance between access resistance and parasitic capacitance through a selection of the liner thickness; i.e. thick enough to sufficiently increase the access resistance (e.g. through a larger contact area with the source/drain structure) but also thin enough to excessively increase the parasitic capacitance.

In embodiments, the liner grown in step c may have a thickness of 3 nm or less, 2.5 nm or less, 2 nm or less, 1.5 nm or less, or even 1.2 nm or less. In embodiments, the liner grown in step c may have a thickness of at least 0.5 nm or at least 1 nm. The thickness of the liner may be selected in order to—at least partially—compensate the semiconductor material loss in step b, but may also take into account other factors such as its influence on the parasitic capacitance (cf. supra). To that effect, the liner thickness (t2 in FIG. 5) could be equal to (i.e. fully compensating the semiconductor layer's distal thickness thinning) the semiconductor material loss (t1 in FIG. 4), or it may be smaller (i.e. partially compensating) or larger (i.e. overcompensating).

In embodiments, the method may comprise a further step d—after step c—, of: (d) filling the recess with a dielectric material, thereby forming an inner spacer (which may alternatively be referred to as an "internal spacer"). The inner spacer may be used to reduce the parasitic capacitance in the final semiconductor structure (e.g. between a gate region and a source/drain structure; cf. infra).

In embodiments, the method may comprise a further step e—after step d—, of: (e) forming a source/drain structure (e.g. SiGe:B or Si:P) in the trench. In embodiments, forming the source/drain structure in the trench may comprise epitaxially growing the source/drain structure in the trench. The source/drain structure (e.g. source/drain contact) may be used to make contact with source/drain regions of the semiconductor layers the final semiconductor structure.

In embodiments, the method may comprise a further step f of: (f) removing the sacrificial layer. In embodiments, step f may be performed after step d, such as after step e. In embodiments, removing the sacrificial layer may be performed preferentially (e.g. selectively) with respect to the semiconductor layer and liner, such as preferentially with respect to the semiconductor layer, liner and inner spacer. For example, removing the sacrificial layer may be performed preferentially with respect to the semiconductor layer, liner, inner spacer and source/drain structure. An opening is typically obtained where the sacrificial layer was removed. The aforementioned notwithstanding, as before a perfect selectivity for removing the sacrificial layer with respect to the semiconductor layer and liner can typically not be achieved, so that some semiconductor material (of the semiconductor layer and/or liner) will normally nevertheless be removed as well during step f. For example,—where the liner makes contact with the sacrificial layer—up to about 1 nm of liner thickness could be lost during step f. For these regions of the liner, the thickness of the liner may after step f be 2 nm or less, 1.5 nm or less, 1.2 nm or less, 1 nm or less, or even 0.8 nm or less, such as being completely removed. (Partially) removing the liner where it contacts the sacrificial layer may be performed because these portions of the liner may negatively impact the parasitic capacitance, while at the same time contributing less to the improvement in access resistance.

In embodiments, step f may further comprise removing the dummy gate region (e.g. prior to or concurrently with removing the sacrificial layer). Step f may also be referred to as a semiconductor layer release step (e.g. a nanowire or nanosheet release).

In embodiments, the method may comprise a further step g—after step f—of: (g) forming a gate region (e.g. a functional gate region) where the sacrificial layer was removed in step f. Step g may thus comprise forming a gate region in the opening obtained after step f In embodiments, forming the gate region may comprise forming a gate dielectric (e.g. a high-k dielectric, such as HfO₂), a work function metal (e.g. TiN, TiAl, or TaN) and a gate metal (e.g. W, Co, or Ru). In embodiments, the gate region may be a gate-all-around gate region. A replacement metal gate (RMG) process may for example be used to perform steps f and g.

In embodiments, any feature of any embodiment of the first aspect may independently be as correspondingly described for any embodiment of any of the other aspects.

In a second aspect, the present disclosure relates to a semiconductor structure, comprising: (i) a substrate; (ii) a layer stack on the substrate, the layer stack comprising at least one semiconductor layer of a semiconductor material and at least one ancillary layer under the semiconductor layer; (iii) a trench through the layer stack; (iv) a recess with respect to the semiconductor layer, the recess abutting the ancillary layer; and (v) a liner of the semiconductor material lining the semiconductor layer—and optionally the ancillary layer—with respect to the trench.

Embodiments of the second aspect thus correspond to the semiconductor structure obtainable after any of steps c-g.

In embodiments, the semiconductor structure may further comprise: (vi) a dummy gate region over (e.g. directly on) the layer stack. In embodiments, the dummy gate region may comprise a dummy gate oxide (e.g. SiO₂) and a dummy gate (e.g. poly-Si). In embodiments, the semiconductor structure may further comprise: (vii) gate spacers (e.g. SiCON or SiBCN) flanking the dummy gate region.

In embodiments, the ancillary layer may comprise a sacrificial layer, an opening or a gate region.

In embodiments, the recess may comprise an inner spacer.

In embodiments, the trench may comprise a source/drain structure.

In embodiments, any feature of any embodiment of the second aspect may independently be as correspondingly described for any embodiment of any of the other aspects.

In a third aspect, the present disclosure relates to a use of a liner of semiconductor material in a semiconductor structure as defined in any of embodiment of the second aspect, for decreasing an access resistance to the semiconductor layer.

In embodiments, any feature of any embodiment of the third aspect may independently be as correspondingly described for any embodiment of any of the other aspects.

The disclosure will now be described by a detailed description of several embodiments of the disclosure. It is clear that other embodiments can be configured according to the knowledge of the person skilled in the art without departing from the technical teaching of the disclosure, the disclosure being limited only by the terms of the appended claims.

As an example of embodiments, an illustrative process flow for forming a gate-all-around field-effect transistor (e.g. a nanowire, nanosheet, forksheet, or complementary field-effect transistor) is depicted in FIGS. 7-13 and described herebelow.

Figure 7:
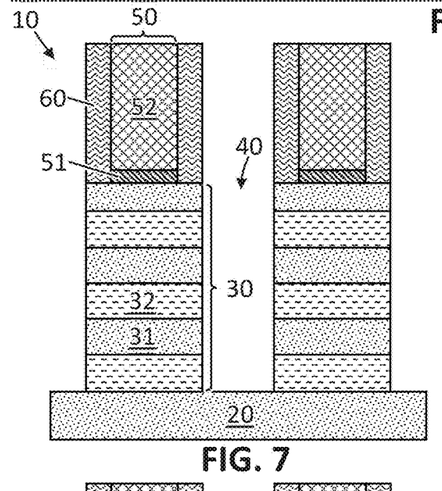
FIG. 7 schematically depicts a semiconductor structure at a stage of an illustrative process flow, according to example embodiments.

We now refer to FIG. 7. A semiconductor structure (10) was provided, comprising a layer stack (30) of alternating sacrificial layers (32) (e.g. SiGe, such as SiGe nanowires or nanosheets) and semiconductor layers (31) (e.g. Si, such as Si nanowires or nanosheets) on a substrate (20) (e.g. a Si wafer). The semiconductor structure (10) further comprised one or more trenches (40), through the layer stack (30) down to the substrate (20); one or more dummy gate regions (50) over the layer stack (30) (e.g. a SiO₂ dummy gate oxide (51) and a poly-Si dummy gate (52)); and gate spacers (e.g. SiCON or SiBCN) (60) flanking the dummy gate region (50).

Figure 8:
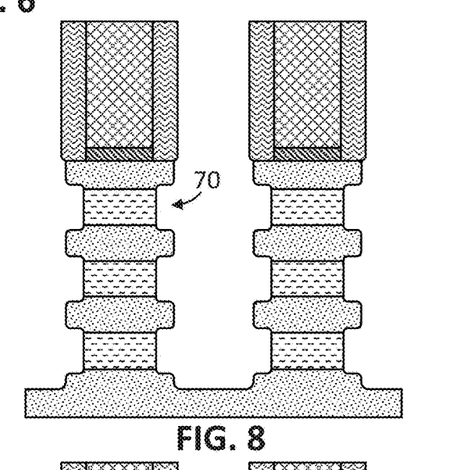
FIG. 8 schematically depicts a semiconductor structure at a stage of an illustrative process flow, according to example embodiments.

We now refer to FIG. 8. One or more recesses (70) were formed in the layer stack (30) by etching a portion of the sacrificial layer (32) exposed by the trench (40). The sacrificial layers (32) were etched preferentially with respect to the semiconductor layer (31), but the selectivity was inevitably imperfect (cf. supra) so that some semiconductor material loss (and possibly substrate (20) material loss) necessarily also occurs (cf. FIG. 3, FIG. 4, and FIG. 6).

Figure 9:
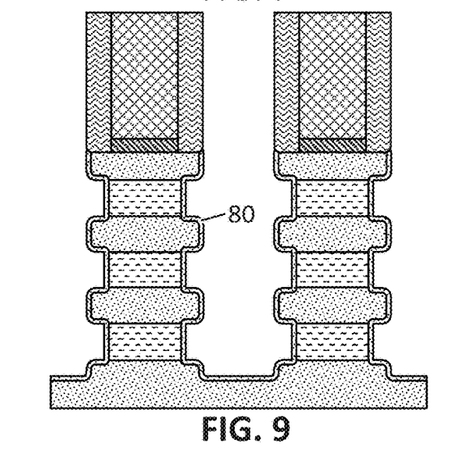
FIG. 9 schematically depicts a semiconductor structure at a stage of an illustrative process flow, according to example embodiments.

We now refer to FIG. 9. In order to compensate the semiconductor material loss, a liner (80) of the semiconductor material (e.g. Si) was epitaxially grown onto surfaces of the semiconductor layers (31)—and optionally of the sacrificial layers (32) and/or substrate (20)—exposed by the trench (40). For example, the liner (80) could line an entire bottom portion of trench (40) extending up to the gate spacers (60). Depending on the desired outcome, the liner (80) could have a thickness (t2 in FIG. 5) smaller than, equal to or larger than the semiconductor material loss (t1 in FIG. 4); i.e. the thinning of the distal thickness (d) may be respectively partially, fully (cf. FIG. 5) or over-compensated. For example, where the liner (80) lines both the semiconductor layers (31) and the sacrificial layers (32), a thicker liner (80) will typically lead to a lower access resistance to the semiconductor layers (31) but will also result in a higher parasitic capacitance. A balance between both may thus be sought by selecting a thickness (t2) for the liner (80).

Figure 10:
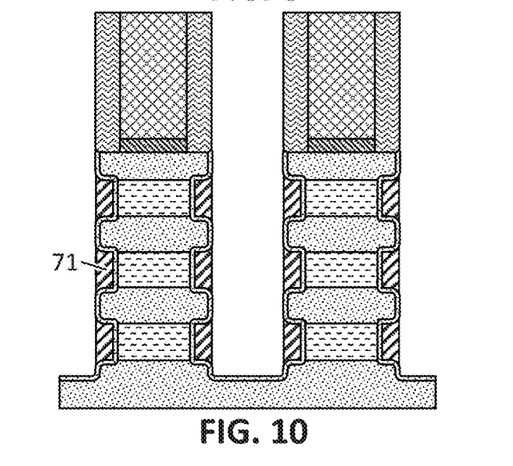
FIG. 10 schematically depicts a semiconductor structure at a stage of an illustrative process flow, according to example embodiments.

We now refer to FIG. 10. The recesses (70) were filled with a dielectric material, thereby forming inner spacers (71).

Figure 11:
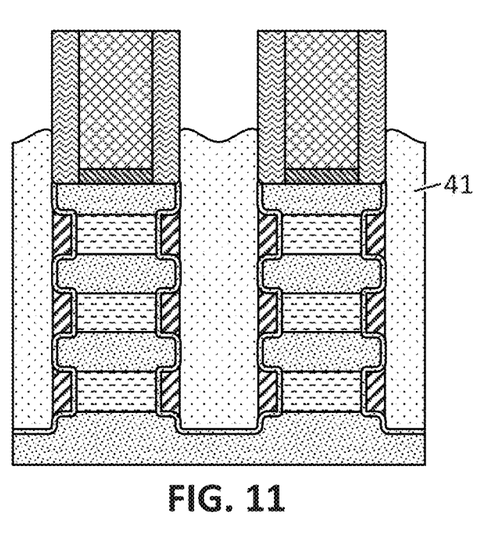
FIG. 11 schematically depicts a semiconductor structure at a stage of an illustrative process flow, according to example embodiments.

We now refer to FIG. 11. The trench (40) was filled (e.g. by epitaxial growth of SiGe:B or Si:P) to form a source/drain structure (41).

Figure 12:
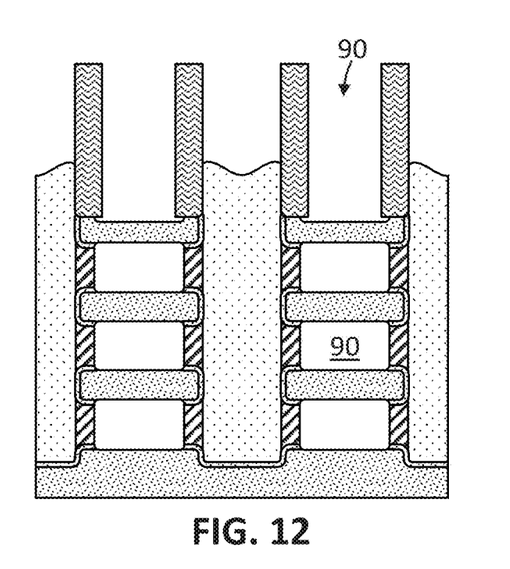
FIG. 12 schematically depicts a semiconductor structure at a stage of an illustrative process flow, according to example embodiments.

We now refer to FIG. 12. The semiconductor layers (31) are released by removing the dummy gate regions (50) and sacrificial layers (32).

Figure 13:
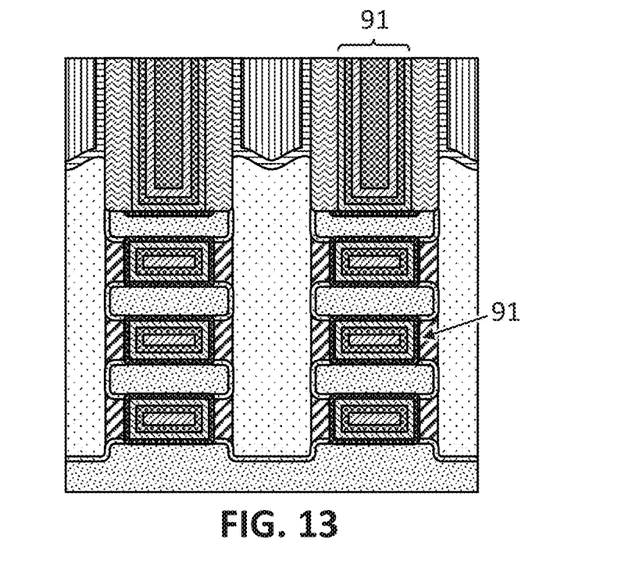
FIG. 13 schematically depicts a semiconductor structure at a stage of an illustrative process flow, according to example embodiments.

We now refer to FIG. 13. Functional replacement gate regions comprising a gate dielectric (e.g. HfO₂), work function metal stack (e.g. TiN, TiAl, or TaN), and metal gate fill (e.g. W, Co, or Ru) (91) were formed in the openings (90) where the sacrificial layers (32) and dummy gate regions (50) were previously removed.

It is to be understood that although example embodiments, specific constructions and configurations, as well as materials, have been discussed herein for devices according to the present disclosure, various changes or modifications in form and detail may be made without departing from the scope and technical teachings of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

What is claimed is:

1. A method for forming a semiconductor structure, comprising:
   a. providing a structure comprising:
      i. a substrate;
      ii. a layer stack on the substrate, wherein the layer stack comprises at least one semiconductor layer of a semiconductor material and at least one sacrificial layer under the semiconductor layer, and wherein the semiconductor material comprises a group IV material or a group III-V material; and iii. a trench through the layer stack;

b. forming a recess in the layer stack by etching a portion of the sacrificial layer exposed by the trench, wherein the etching comprises a preferential etch of the sacrificial layer with respect to the semiconductor layer;

c. epitaxially growing a liner of the semiconductor material that entirely covers all surfaces of the semiconductor layer exposed by the trench and all surfaces of the sacrificial layer exposed by the trench; and d. after step c, filling the recess with a dielectric material, thereby forming an inner spacer.

2. The method according to claim 1, wherein the liner comprises Si.

3. The method according to claim 1, wherein the liner grown in step c has a thickness ($t_2$) of 3 nm or less.

4. The method according to claim 1, wherein the layer stack comprises a plurality of semiconductor layers alternated with sacrificial layers.

5. The method according to claim 1, further comprising a step e, after step d, wherein step e comprises forming a source/drain structure in the trench.

6. The method according to claim 5, wherein forming the source/drain structure in the trench comprises epitaxially growing the source/drain structure in the trench.

7. The method according to claim 1, further comprising removing the sacrificial layer.

8. The method according to claim 7, further comprising, after removing the sacrificial layer, forming a gate region where the sacrificial layer was removed.

9. The method according to claim 8, wherein forming the gate region comprises forming a gate dielectric, a work function metal, and a gate metal.

10. The method according to claim 1, wherein the method is performed to form a gate-all-around field-effect transistor.

* * * * *